United States Patent [19]

Bagchi et al.

[11] Patent Number: 5,055,379
[45] Date of Patent: Oct. 8, 1991

[54] PHOTORESIST DICHROMATE COMPOSITION CONTAINING GELATIN COATED PARTICLES

[75] Inventors: Pranab Bagchi, Webster; Raymond F. Reithel, Rochester; Tsang J. Chen, Rochester; Steven Evans, Rochester, all of N.Y.

[73] Assignee: Eastman Kodak Company, Rochester, N.Y.

[21] Appl. No.: 495,871

[22] Filed: Mar. 19, 1990

[51] Int. Cl.[5] .................................... G03C 1/66
[52] U.S. Cl. ............................. 430/289; 430/7; 430/213; 430/238; 430/245; 430/320; 430/271; 430/274
[58] Field of Search .............. 430/289, 274, 271, 7, 430/213, 238, 245, 320, 510, 511, 518

[56] References Cited

U.S. PATENT DOCUMENTS

| | | | |
|---|---|---|---|
| 2,704,253 | 3/1955 | Janet | 430/289 |
| 2,716,060 | 8/1955 | Lupo | 430/289 |
| 2,716,061 | 8/1955 | Lupo | 430/289 |
| 4,089,687 | 5/1978 | Harper | 430/289 |
| 4,443,514 | 4/1984 | Yamamoto et al. | 428/216 |
| 4,764,670 | 9/1987 | Pace et al. | 250/226 |
| 4,855,219 | 9/1987 | Bagchi et al. | 430/496 |
| 4,942,103 | 7/1990 | Reithel et al. | 430/289 |

FOREIGN PATENT DOCUMENTS

| | | |
|---|---|---|
| 307855 | 9/1988 | European Pat. Off. . |
| 307856 | 9/1988 | European Pat. Off. . |

Primary Examiner—Jack P. Brammer
Attorney, Agent, or Firm—J. Jeffrey Hawley

[57] ABSTRACT

A negative-working photoresist composition comprising, in admixture, (a) dye-loaded or dye-precursor-loaded polymeric particles individually covered with a layer of gelatin that is covalently bonded thereto and (b) a radiation-sensitive dichromate is useful in the preparation of continuous tone dyed imaging elements such as color filter arrays for use in solid state color image sensing devices.

16 Claims, 2 Drawing Sheets

PHOTORESIST DICHROMATE COMPOSITION CONTAINING GELATIN COATED PARTICLES

BACKGROUND OF THE INVENTION

In a useful method for the fabrication of color filter elements for solid state electronic color image sensing devices, for example, CCD, CID and MOS devices, dyed filter elements are formed by coating photopatternable layers, imagewise exposing, washing off unexposed layer portions and then dyeing the remaining filter layer by dye imbibition. In one approach, a hydrophilic colloid, for example, gelatin, can be suspended in water along with a radiation responsive hardening (i.e., crosslinking) agent to form the photopatternable composition. In another approach, a diazo resin can be mixed with a mordant to produce a photopatternable composition to form the dyeable filter elements. These approaches are described, for example, in U.S. Pat. No. 4,764,670.

However, these and other approaches have not been entirely satisfactory. For example, the step of dyeing the exposed filter layer by dye imbibition generally leads to swelling of the image layer. Also, these approaches generally require the use of interlayers (so-called barrier layers) to prevent the dyes from migrating between contiguous filter layers. Dye wandering or leaching leads to undesirable non-uniform dye densities and decreases in image resolution. It would be desirable to provide a pre-dyed resist composition which does not suffer from image swelling as in the case of post-dyed resist systems. Perhaps more importantly, it would be highly desirable to provide a resist composition for a color filter array system which does not require the use of barrier layers.

SUMMARY OF THE INVENTION

We have discovered a negative-working dyeable photoresist composition which can be pre-dyed and does not suffer from image swelling as in the case of post-dyed resist compositions.

More particularly, in accordance with this invention, there is provided a negative-working photoresist composition comprising, in admixture, dye-loaded or dye-precursor-loaded polymeric particles individually covered with a layer of gelatin that is covalently bonded thereto, and (b) a radiation-sensitive dichromate.

Dyed photoresist compositions of this invention can be used to form color filter arrays in solid state electronic color image sensing devices which do not require the presence of barrier layers to prevent the dyes from migrating between contiguous filter layers. This is particularly advantageous inasmuch as the number of steps required in the fabrication of solid state color sensors can be reduced. Such reduction constitutes a major advantage in reducing fabrication waste arising from manufacturing defects.

In another aspect of this invention, there is provided a method of producing a dyeable negative-working image comprising imagewise exposing to activating radiation the above-described photoresist composition and developing the exposed composition so that only the exposed areas remain.

In yet another aspect of this invention, there is provided a solid state color image sensing device comprising a semiconductive support having a surface comprising an array of light-sensing pixels and superimposed thereon in microregistration a color filter array having three sets of dyed filter elements at least one set of which is formed from the above-described photoresist composition.

DESCRIPTION OF THE PREFERRED EMBODIMENTS

Figure 1:
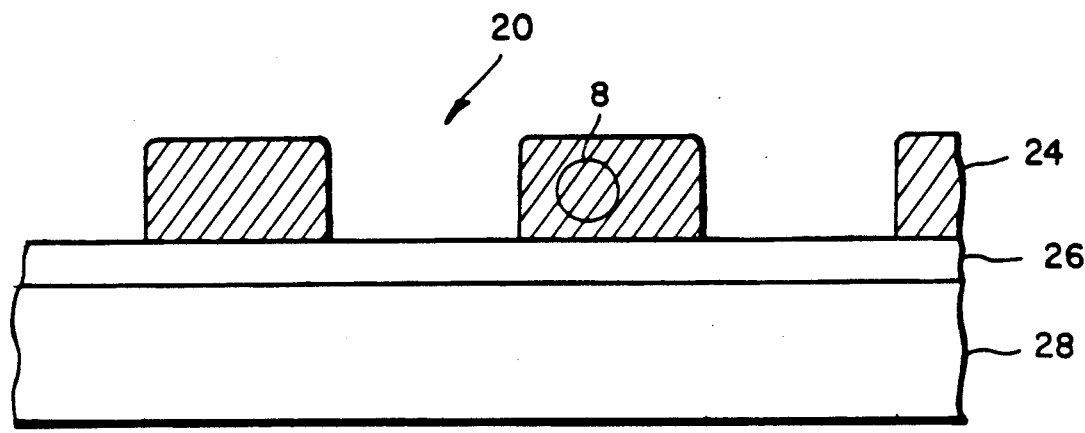
FIG. 1 is a schematic view of a photoresist image in accordance with this invention.

The photoresist of this invention will be described primarily in connection with its utility in the preparation of color filter arrays for solid state color image sensing devices and in methods for preparing such devices. However, the invention is useful in a variety of fields wherein continuous tone images are employed. For example, continuous tone imaging is useful in pre-press color proofing elements, in graphic arts print film, in microfiche print film, as an intermediate or release print for video disc applications, as an intermediate film for UV contact exposure in liquid crystal displays, in color wheels and the like.

Polymer particles useful in the present invention are those that contain recurring units that are capable of covalently bonding with gelatin directly or with the aid of an activator or a grafting aid.

Monomers from which polymers can be derived that are capable of directly bonding with gelatin through the amine group of gelatin are as follows:

1. Suitable activated halogen-containing monomers include monomers having appended halomethylaryl, halomethylcarbonyl, halomethylsulfonyl, haloethylcarbonyl, and haloethylsulfonyl groups which will, after polymerization, also undergo crosslinking with a suitable crosslinking agent such as a diamine, dithiol, diol, and so forth.

Monomers having halomethylaryl groups, for example, vinylbenzyl chloride, and vinylbenzyl bromide, are disclosed in U.S. Pat. No. 4,017,442.

Useful monomers having appended haloethylsulfonyl groups such as m- and p-(2-chloroethylsulfonylmethyl)styrene and N-(4-chloroethylsulfonylmethylphenyl)acrylamide are described in U.S. Pat. Nos. 4,161,407 and 4,548,870.

Polymers having appended halomethylcarbonyl or haloethylcarbonyl groups such as chloroacetyl and chloropropionyl, are described in U.S. Pat. No. 3,625,694. Monomers which provide such crosslinkable groups include:
vinyl chloroacetate,
N-(3-chloroacetamidopropyl)methacrylamide,
2-chloroacetamidoethyl methacrylate,
4-chloroacetamidostyrene,
m- and p-chloracetamidomethylstyrene,
N-(3-chloroacetamidocarbonyliminopropyl)methacrylamide,
2-chloroacetamidocarbonyliminoethyl methacrylate,
4-chloroacetamidocarbonyliminostyrene,
m- and p-chloroacetamidocarbonyliminomethylstyrene,
N-vinyl-N'-(3-chloropropionyl)urea, 4-(3-chloropropionamido)styrene,
4-(3-chloropropionamidocarbonylimino)styrene,
2-(3-chloropropionamido)ethyl methacrylate, and
N-[2-(3-chloropropionamido)ethyl]methacrylamide.

2. Another variety of useful active halogen monomers includes those having appended triazinyl groups such as
N-[3-(3,5-dichloro-1-triazinylamino)propyl]methacrylamide.

3. Active ester group-containing monomers are disclosed in U.S. Pat. No. 4,548,870. Preferred active ester monomers are
N-[2-(ethoxycarbonylmethoxycarbonyl)ethyl]acrylamide,
N-(3-methacrylamidopropionyloxy)succinimide,
N-(acryloyloxy)succinimide, and
N-(methacryloyloxy)succinimide.

4. Polymers having appended aldehyde groups as crosslinkable sites are also disclosed in U.S. Pat. No. 3,625,694. Monomers providing such groups are p-methacryloyloxybenzaldehyde, vinylbenzaldehyde and acrolein.

5. Monomers having appended aziridine groups such as
N-acryloylaziridine,
N-(N-vinylcarbamyl)aziridine, and
2-(1-aziridinyl)ethyl acrylate,
as described in U.S. Pat. No. 3,671,256.

6. Monomers having appended isocyanates (e.g., isocyanatoethyl acrylate, isocyanatoethyl methacrylate, or α,α-dimethylmetaisopropenylbenzyl isocyanate).

Monomers, the polymers and copolymers of which are capable of covalently bonding with gelatin through the use of a grafting agent, include carboxylic acids (e.g., acrylic acid, methacrylic acid, itaconic acid, and maleic acid or anhydride), amine-containing monomers (e.g., 2-aminoethyl methacrylate and N-(3-aminopropyl)methacrylamide hydrochloride), and active methylene group-containing monomers (e.g., 2-acetoacetoxyethyl methacrylate and diacetone acrylamide).

Gelatin grafting agents that can be utilized for the attachment of gelatin to polymer particles having carboxyl groups are as follows:

(1) Carbamoylonium salts are used for covalent attachment of the reactive amine- or sulfhydryl- containing compound (gelatin) to the polymeric particles having carbonyl groups in the practice of this invention. These salts are described in some detail in U.S. Pat. No. 4,421,847 (issued Dec. 20, 1983 to Jung et al), and are generally represented by the structure:

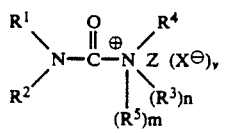

(I)

In structure (I), Z represents the atoms necessary to complete a substituted or unsubstituted 5- or 6-membered heterocyclic aromatic ring including heterocyclic rings having a fused carbocyclic ring (for example a pyridinium, imidazolium, thiazolium, isoxazolium or quinolinium ring). Preferably, Z represents the atoms necessary to complete a substituted 6-membered heterocyclic aromatic ring.

Further, m and n are independently 0 to 1.

$R^1$ and $R^2$ are, independently of each other, substituted or unsubstituted alkyl (generally of 1 to 6 carbon atoms, for example, methyl, ethyl, isopropyl or chloromethyl) or substituted or unsubstituted aryl (generally of 6 to 10 carbon atoms, for example phenyl, p-methylphenyl, m-chlorophenyl or naphthyl), or substituted or unsubstituted aralkyl (generally of 7 to 12 carbon atoms, for example benzyl or phenethyl which can be substituted in the same manner as the aryl group).

Alternatively, $R^1$ and $R^2$ together represent the atoms necessary to complete a piperidine, piperazine or morpholine ring, which ring can be substituted for example with one or more alkyl groups each having 1 to 3 carbon atoms or by a halo atom.

$R^3$ is a hydrogen atom, a substituted or unsubstituted alkyl as defined above for $R^1$, or the group $+A]$ wherein A represents the polymerized vinyl backbone of a homo- or copolymer formed from one or more ethylenically unsaturated polymerizable compounds such that the molecular weight of the homo- or copolymer is greater than about 1000. Useful ethylenically unsaturated polymerizable compounds are known to one of ordinary skill in the polymer chemistry art. The polymer [A] can comprise additional moieties derived from the compounds represented by structure (I).

$R^4$ is a hydrogen atom, a substituted or unsubstituted alkyl (as defined above for $R^1$), or when Z represents the atoms necessary to complete a pyridinium ring and n is 0, $R^4$ is selected from the following groups:

(a) $-NR^6-CO-R^7$ wherein $R^6$ is hydrogen or substituted or unsubstituted alkyl (generally of 1 to 4 carbon atoms, for example methyl, ethyl, n-butyl, chloromethyl), $R^7$ is hydrogen, substituted or unsubstituted alkyl (as defined above for $R^6$) or $-NR^8R^9$ wherein $R^8$ and $R^9$ are, independently of each other, hydrogen or substituted or unsubstituted alkyl (as defined above for $R^6$), (b) $-(CH_2)_q-NR^{10}R^{11}$ wherein $R^{10}$ is $-CO-R^{12}$, $R^{11}$ is hydrogen or substituted or unsubstituted alkyl (as defined above for $R^6$), $R^{12}$ is hydrogen, substituted or unsubstituted alkyl (as defined above for $R^6$) or $-NR^{13}R^{14}$ wherein $R^{13}$ is substituted or unsubstituted alkyl (as defined above for $R^6$) or substituted or unsubstituted aryl (as defined above for $R^1$), $R^{14}$ is hydrogen, substituted or unsubstituted alkyl (as defined above for $R^6$) or substituted or unsubstituted aryl (as defined for $R^1$), and q is an integer from 1 to 3, (c) $-(CH_2)_r-CONR^{15}R^{16}$ wherein $R^{15}$ is hydrogen, substituted or unsubstituted alkyl (as defined above for $R^6$) or substituted or unsubstituted aryl (as defined above for $R^1$), $R^{16}$ is hydrogen or substituted or unsubstituted alkyl (as defined above for $R^6$), or $R^{15}$ and $R^{16}$ together represent the atoms necessary to complete a 5- or 6-membered aliphatic ring, and r is 0 or an integer from 1 to 3,

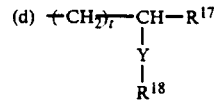

wherein $R^{17}$ is hydrogen, substituted or unsubstituted alkyl (as defined above for $R^6$), Y is oxy or $-NR^{19}-$, $R^{18}$ is hydrogen, substituted or unsubstituted alkyl (as defined above for $R^6$), $-CO-R^{20}$ or $-CO-NHR^{21}$ wherein $R^{19}$, $R^{20}$ and $R^{21}$ are, independently of each other, hydrogen or substituted or unsubstituted alkyl (as defined above for $R^6$), and t is 2 or 3, and (e) —$R^{21}X'^{\ominus}$ wherein $R^{21}$ is substituted or unsubstituted alkylene of from 1 to 6 carbon atoms (for example, methylene, trimethylene or isopropylene), and $X'^{\ominus}$ is a covalently bonded anionic group such as sulfonate or carboxylate so as to form an inner salt group with the pyridinium nucleus.

$R^5$ is substituted or unsubstituted alkyl (as defined above for $R^6$), substituted or unsubstituted aryl (as defined above for $R^1$) or substituted or unsubstituted aralkyl (as defined above for $R^1$), provided that m is 0 when the nitrogen atom to which $R^5$ is bound is attached to the remainder of the ring through a double bond.

$X^{\ominus}$ is an anion, such as a halide, tetrafluoroborate, nitrate, sulfate, p-toluenesulfonate, perchlorate, methosulfate or hydroxide, and v is 0 or 1, provided that it is 0 only when $R^4$ is —$R^{21}X'^{\ominus}$.

Preferably, the carbamoylonium compound used in the practice of this invention is represented by the structure above wherein $R^1$ and $R^2$ together represent the atoms necessary to complete a morpholine ring, Z represents the atoms necessary to complete a pyridinium ring, $R^4$ is —$R^{21}X'^{\ominus}$ (such as —$CH_2CH_2SO_3^-$), and m, n and v are each 0.

Representative preferred carbamoylonium compounds include 1-(4-morpholinocarbonyl)-4-(2-sulfoethyl)pyridinium hydroxide, inner salt, and 1-(4-morpholinocarbonyl)pyridinium chloride, most preferably, 1-(4-morpholinocarbonyl)-4-(2-sulfoethyl)pyridinium hydroxide, inner salt.

The carbamoylonium compounds useful in the practice of this invention can be obtained commercially, or prepared using known procedures and starting materials, such as described in U.S. Pat. No. 4,421,847 (noted above), and references noted therein, incorporated herein by reference. Some examples of such compounds are listed in Table I.

TABLE I

Carbamoylonium Gelatin-Grafting Agents

| Structure | Carbamoylonium Compound Number |
|---|---|
| $CH_3$-N($CH_3$)-CO-N$^{\oplus}$(pyridinium)-SO$_3^{\ominus}$ | 1 |
| $C_2H_5$-N($C_2H_5$)-CO-N$^{\oplus}$(pyridinium)-SO$_3^{\ominus}$ | 2 |
| $CH_3$-N($CH_3$)-CO-N$^{\oplus}$(4-CH$_3$-pyridinium)-SO$_3^{\ominus}$ | 3 |
| piperidino-CO-N$^{\oplus}$(pyridinium)-SO$_3^{\ominus}$ | 4 |
| morpholino-CO-N$^{\oplus}$(pyridinium)-SO$_3^{\ominus}$ | 5 |
| (4-CH$_3$-C$_6$H$_4$)-N(CH$_3$)-CO-N$^{\oplus}$(pyridinium)-SO$_3^{\ominus}$ | 6 |

TABLE I-continued

Carbamoylonium Gelatin-Grafting Agents

| Structure | Carbamoylonium Compound Number |
|---|---|
| 4-chlorophenyl(methyl)N—CO—N⁺(pyridinium-3-SO₃⁻) | 7 |
| benzyl(methyl)N—CO—N⁺(pyridinium-3-SO₃⁻) | 8 |
| (CH₃)₂N—CO—N⁺(pyridinium)—CH₂—CH₂—SO₃⁻ (4-position) | 9 |
| (C₂H₅)₂N—CO—N⁺(pyridinium)—CH₂—CH₂—SO₃⁻ (4-position) | 10 |
| (CH₃)₂N—CO—N⁺(pyridinium)—CH₂—CH₂—SO₃⁻ (3-position) | 11 |
| 4-methylphenyl(methyl)N—CO—N⁺(pyridinium)—CH₂—CH₂—SO₃⁻ | 12 |
| piperidinyl-N—CO—N⁺(pyridinium)—CH₂—CH₂—SO₃⁻ | 13 |
| piperidinyl-N—CO—N⁺(3-ethyl-5-(CH₂—CH₂—SO₃⁻)pyridinium) | 14 |
| morpholinyl-N—CO—N⁺(pyridinium)—CH₂—CH₂—SO₃⁻ (4-position) | 15 |
| morpholinyl-N—CO—N⁺(pyridinium)—CH₂—CH₂—SO₃⁻ (3-position) | 16 |

TABLE I-continued
Carbamoylonium Gelatin-Grafting Agents

| Structure | Carbamoylonium Compound Number |
|---|---|
| Morpholine-N-CO-N⁺(pyridinium with CH₃ and CH₂-CH₂-SO₃⁻) | 17 |
| (CH₃)₂N-C(=O)-N⁺(pyridinium) PF₆⁻ | 18 |
| Pyrrolidine-N-C(=O)-N⁺(pyridinium-NHCONHCH₃) Cl⁻ | 19 |
| Pyrrolidine-N-C(=O)-N⁺(pyridinium) Cl⁻ | 20 |
| C₆H₅(CH₃)N-C(=O)-N⁺(pyridinium-CONH₂) BF₄⁻ | 21 |
| (4-Cl-C₆H₄)(CH₃)N-C(=O)-N⁺(pyridinium-SO₃⁻) | 22 |
| (C₂H₅)₂N-C(=O)-N⁺(pyridinium-CH₂CH₂SO₃⁻) Na⁺Cl⁻ | 23 |
| Morpholine-N-C(=O)-N⁺(pyridinium-CH₂CH₂SO₃⁻) Na⁺Cl⁻ | 24 |
| Piperidine-N-C(=O)-N⁺(pyridinium with C₂H₅ and CH₂CH₂SO₃⁻) Na⁺Cl⁻ | 25 |

The above compounds can be synthesized readily by literature methods. Carbamic acid chlorides are synthesized from secondary amines with, for example, phosgene, and are then reacted in the dark with aromatic heterocyclic nitrogen-containing compounds. The synthesis of compound 3 has been described in Chem. Ber., 40, p. 1831 (1907). Other synthetic methods can be found in the German patent applications 2,225,230; 2,317,677; and 2,439,551.

(2) Dication ethers are also useful as grafting agents for bonding gelatin to a polymer particle containing carboxyl groups.

Useful dication ethers have the formula:

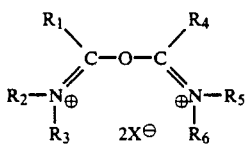

(II)

In this formula, $R_1$ represents hydrogen, alkyl, aralkyl, aryl, alkenyl, $-YR_7$,

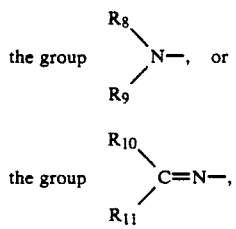

with Y representing sulfur or oxygen, and $R_7$, $R_8$, $R_9$, $R_{10}$ and $R_{11}$ each independently representing alkyl, aralkyl, aryl, or alkenyl. Alternatively, $R_8$ and $R_9$, or $R_{10}$ and $R_{11}$ may together form a ring structure. $R_{10}$ and $R_{11}$ may each also represent hydrogen. Also, $R_1$ together with $R_2$ may form a heterocyclic ring.

$R_2$ and $R_3$ each independently represents alkyl, aralkyl, aryl, or alkenyl, or, combined with $R_1$ or each other, forms a heterocyclic ring.

$R_4$, $R_5$, and $R_6$ are independently defined as are $R_1$, $R_2$, and $R_3$, respectively, and can be the same as or different from $R_1$, $R_2$, and $R_3$.

$X^\ominus$ represents an anion or an anionic portion of the compound to form an intramolecular (inner) salt.

Dication ethers of formula (II) are described in further detail below.

Preferably, $R_1$ is hydrogen, alkyl of 1 to 20 carbon atoms (e.g., methyl, ethyl, butyl, 2-ethylhexyl, or dodecyl), aralkyl of from 7 to 20 carbon atoms (e.g., benzyl, phenethyl), aryl of from 6 to 20 carbon atoms (e.g., phenyl, naphthyl), alkenyl of from 2 to 20 carbon atoms (e.g., vinyl, propenyl),

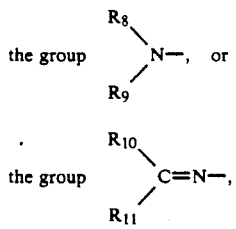

$R_1$ can combine with $R_2$ or $R_3$ to form a heterocyclic ring of 5 to 8 atoms. This ring contains the nitrogen atom to which $R_2$ and $R_3$ are attached in formula (II) and may contain an additional nitrogen atom, or an oxygen or sulfur atom. Examples of such rings include pyridine, quinoline, isoquinoline, thiazole, benzothiazole, thiazoline, oxazole, benzoxazole, imidazole, benzimidazole, and oxazoline.

$R_7$, $R_8$, $R_9$, $R_{10}$, and $R_{11}$ are preferably alkyl of 1 to 20 carbon atoms (e.g., methyl, ethyl, butyl, 2-ethylhexyl, or dodecyl), aralkyl of from 7 to 20 carbon atoms (e.g., benzyl, phenethyl), aryl of from 6 to 20 carbon atoms (e.g., phenyl, naphthyl), or alkenyl of from 2 to 20 carbon atoms (e.g., vinyl, propenyl).

$R_8$ and $R_9$, or $R_{10}$ and $R_{11}$ can also combine to form a ring structure of 5 to 8 atoms. The $R_8-R_9$ ring contains the nitrogen atom to which $R_8$ and $R_9$ are attached, and may also contain an additional nitrogen atom, or an oxygen or sulfur atom. The $R_{10}-R_{11}$ ring may also contain one or more nitrogen atoms, an oxygen atom, a sulfur atom, or any combination thereof. Examples of such rings include pyrrolidine, piperidine, and morpholine. Preferably, $R_2$ and $R_3$ may each be alkyl of 1 to 20 carbon atoms (e.g., methyl, ethyl, butyl, 2-ethylhexyl, or dodecyl), aralkyl of from 7 to 20 carbon atoms (e.g., benzyl, phenethyl), aryl of from 6 to 20 carbon atoms (e.g., phenyl, naphthyl), or alkenyl of from 2 to 20 carbon atoms (e.g., vinyl, propenyl). $R_2$ and $R_3$ also preferably combine with each other to form a heterocyclic ring of 5 to 8 atoms. This ring contains the nitrogen atom to which $R_2$ and $R_3$ are attached, and may also contain an additional nitrogen atom, or an oxygen or sulfur atom. Examples of such rings include pyrrolidine, piperidine, and morpholine. Either of $R_2$ or $R_3$ can combine with $R_1$ to form a heterocyclic ring, as described above in reference to $R_1$.

$X^\ominus$ may be any anion that forms a salt compound according to formula (II) that is useful according to the invention. Preferred anions include a sulfonate ion such as methylsulfonate or p-toluenesulfonate,

In addition to the above-described alkyl, aralkyl, aryl, alkenyl, and heterocyclic groups, groups also useful as $R_1$, $R_2$, $R_3$, $R_4$, $R_5$, $R_6$, $R_7$, and $R_8$ include substituted alkyl, aralkyl, aryl, alkenyl, and heterocyclic groups. Useful substituents include halogen, alkoxy of from 1 to 20 carbon atoms, aryloxy of from 6 to 20 carbon atoms, a sulfo group, N,N-disubstituted carbamoyl, N,N-disubstituted sulfamoyl, and other groups known to those skilled in the art that do not prevent the compounds from functioning as reactive intermediates according to the invention.

Examples of compounds of formula (II) are shown below in Table II.

TABLE II

| Dication Ether Gelatin-Grafting Agents | | Dication Ether Number |
|---|---|---|
| 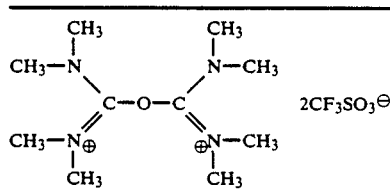 | $2CF_3SO_3^\ominus$ | 1 |

TABLE II-continued

Dication Ether Gelatin-Grafting Agents

| Structure | Dication Ether Number |
|---|---|
| Bis(N-methylpyridinium-2-yl) ether, 2CF$_3$SO$_3^\ominus$ | 2 |
| Bis(tetraethylguanidinium) ether, 2CF$_3$SO$_3^\ominus$ | 3 |
| Bis(1,3-dimethylimidazolinium-2-yl) ether, 2CF$_3$SO$_3^\ominus$ | 4 |
| Bis(N,N,N'-trimethylformamidinium) ether, 2CF$_3$SO$_3^\ominus$ | 5 |
| Bis(N,N,C-triphenylformamidinium) ether, 2BF$_4^\ominus$ | 6 |
| Bis[(4-methoxyphenyl)(N,N-diphenylamino)methylidene] ether, 2PF$_6^\ominus$ | 7 |
| Bis(N-ethylquinolinium-2-yl) ether, 2CH$_3$SO$_3^\ominus$ | 8 |
| Bis[N-(4-sulfonatobutyl)pyridinium-2-yl] ether | 9 |

TABLE II-continued
Dication Ether Gelatin-Grafting Agents

| Structure | Dication Ether Number |
|---|---|
| (morpholino-type tetracyclic dication ether) 2CF$_3$SO$_3^\ominus$ | 10 |
| bis(3-methylbenzoxazolium-2-yl) ether 2CF$_3$SO$_3^\ominus$ | 11 |
| bis(3-methylbenzothiazolium-2-yl) ether 2CF$_3$SO$_3^\ominus$ | 12 |
| bis[3-(4-sulfobutyl)benzothiazolium-2-yl] ether | 13 |
| bis[N-cyclohexyl-N',N'-dimethylamidinium] ether 2CF$_3$SO$_3^\ominus$ | 14 |
| (1-methylpyridinium-2-yl)(N,N,N',N'-tetraethylamidinium) ether 2CF$_3$SO$_3^\ominus$ | 15 |
| bis[N-ethyl-N-methyl-N'-ethyl-N'-methylamidinium] ether 2CF$_3$SO$_3^\ominus$ | 16 |

TABLE II-continued
Dication Ether Gelatin-Grafting Agents

| Structure | Dication Ether Number |
|---|---|
| Bis(N-ethylpyridinium-2-yl) ether, 2CF$_3$SO$_3^\ominus$ | 17 |
| Bis[N-(2-sulfatoethyl)pyridinium-2-yl] ether | 18 |
| N-(2-sulfatoethyl)pyridinium-2-yl N-methylpyridinium-2-yl ether, CF$_3$SO$_3^\ominus$ | 19 |
| N-(3-sulfatopropyl)pyridinium-2-yl N-methylpyridinium-2-yl ether, BF$_4^\ominus$ | 20 |
| N-(2-sulfatoethyl)pyridinium-2-yl N-methylpyridinium-2-yl ether, PF$_6^\ominus$ | 21 |
| N-(2-sulfatoethyl)pyridinium-2-yl 4-acetamido-N-methylpyridinium-2-yl ether, CF$_3$SO$_3^\ominus$ | 22 |
| N-methylpyridinium-2-yl 4-sulfonato-N-methylpyridinium-2-yl ether, CF$_3$SO$_3^\ominus$ | 23 |

TABLE II-continued

Dication Ether Gelatin-Grafting Agents

| Structure | Dication Ether Number |
|---|---|
| (pyridinium-O-chloropyridinium), N⁺-(CH₂)₂-OSO₃⁻ ; N⁺-CH₃ ; CF₃SO₃⁻ | 24 |
| (pyridinium-O-methylpyridinium), N⁺-(CH₂)₃-OSO₃⁻ ; N⁺-C₃H₇ ; BF₄⁻ | 25 |
| (chloropyridinium-O-pyridinium), N⁺-(CH₂)₂-OSO₃⁻ ; N⁺-C₃H₇ ; BF₄⁻ | 26 |
| (pyridinium-O-pyridinium), N⁺-(CH₂)₂-OSO₃⁻ ; N⁺-CH₃ ; CF₃SO₃⁻ | 27 |
| (benzothiazolium-O-pyridinium), N⁺-(CH₂)₂-OSO₃⁻ ; N⁺-CH₃ ; CF₃SO₃⁻ | 28 |
| (sulfonatopyridinium-O-sulfonatopyridinium), ⁻O₃S / SO₃⁻ ; N⁺-CH₃ ; N⁺-CH₃ | 29 |

TABLE II-continued

Dication Ether Gelatin-Grafting Agents

| Structure | Dication Ether Number |
|---|---|
| Pyridinium-O-(4-methylpyridinium), each N-(CH$_2$)$_2$-OSO$_3^{\ominus}$ | 30 |
| Pyridinium-O-pyridinium with NHCOCH$_3$ substituent, each N-(CH$_2$)$_2$-OSO$_3^{\ominus}$ | 31 |
| Pyridinium-O-pyridinium with SO$_3^{\ominus}$ substituent; left N-(CH$_2$)$_2$-OSO$_3^{\ominus}$, right N-CH$_3$ | 32 |
| Pyridinium-O-(4-methylpyridinium), each N-(CH$_2$)$_2$-OSO$_3^{\ominus}$ | 33 |
| Pyridinium-O-pyridinium with CH$_3$ and SO$_3^{\ominus}$ substituents, each N-CH$_3$, BF$_4^{\ominus}$ | 34 |
| $^{\ominus}$O$_3$S—(CH$_2$)$_3$—N$^{\oplus}$(CH$_3$)=C(N(CH$_3$)$_2$)—O—C($^{\oplus}$N(CH$_3$)$_2$)=N(CH$_3$)—(CH$_2$)$_3$—SO$_3^{\ominus}$ | 35 |

TABLE II-continued
Dication Ether Gelatin-Grafting Agents

| | Dication Ether Number |
|---|---|
| 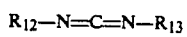 | 36 |
| (structure) | 37 |

The ethers of formula (II) can be made by techniques known to those skilled in the chemical synthesis art. Useful synthesis techniques include those described in Journal of American Chemical Society, 103, 4839 (1981).

(3) Carbodiimides can also be used to attach gelatin to carboxylated latex particles.

Particularly preferred carbodiimide coupling agents are water-soluble carbodiimides of the formula:

$$R_{12}-N=C=N-R_{13}$$

wherein each of $R_{12}$ or $R_{13}$ is selected from: cycloalkyl having from 5 to 6 carbon atoms in the ring; alkyl of from 1 to 12 carbon atoms e.g., methyl, ethyl, n-propyl, isopropyl, n-butyl, sec.-butyl, isobutyl, tert.-butyl, amyl, hexyl, heptyl, octyl, nonyl, undecyl and dodecyl; monoarylsubstituted lower alkyl radicals, e.g., benzyl- α- and β-phenylethyl; monoaryl radicals, e.g., phenyl; morpholino; piperidyl; morpholinyl substituted with lower alkyl radicals, e.g., ethylmorpholinyl; piperidyl substituted with lower alkyl radicals, e.g., ethylpiperidyl; di-lower alkylamino; pyridyl substituted with lower alkyl radicals, e.g., α, β and γ methyl- or ethyl-pyridyl; acid addition salts; and quaternary amines thereof.

Polymers useful in the invention preferably comprise at least 0.1 mole percent and more preferably at least 1 mole percent of monomers, the polymers or copolymers of which are capable of covalently bonding with gelatin, either directly or with the aid of a cross-linking agent.

In one embodiment of the invention, the polymer useful in the present invention is represented by the formula:

    (III)

wherein A represents recurring units derived from one or more of the monomers described above that are capable of covalently bonding with gelatin, and B represents recurring units derived from one or more other ethylenically unsaturated monomers.

Monomers represented by B include essentially any monomer capable of copolymerizing with the above-described monomers without rendering them incapable of covalently bonding with gelatin. Examples of such monomers include ethylenically unsaturated monomers such as styrene and styrene derivatives (e.g., vinyltoluene, divinylbenzene, and 4-t-butylstyrene), and acrylic and methacrylic acid esters (e.g., methyl methacrylate, methyl acrylate, ethyl methacrylate, n-butyl acrylate, 2-ethylhexyl methacrylate, 2-hydroxyethyl methacrylate, 2-hydroxyethyl acrylate, ethylene dimethacrylate, methacrylamide, and acrylonitrile). Among the comonomers B, it is preferred that there be incorporated sufficient monomers which impart a low glass transition temperature (Tg) to the polymer. By low Tg is meant below about 20° C., preferably below about 10° C. Typical monomers which contribute to low Tg's are butyl acrylate, propyl acrylate, 2-ethylhexyl methacrylate and lauryl methacrylate. The amounts of such monomers can be up to about 98%. In such a copolymer, the amount of comonomer that is capable of covalently bonding with gelatin should be sufficient to bind a contiguous layer of gelatin to the surface of the polymer particle.

In the above formula, x represents from 0.1 to 100 mole percent and preferably from 1 to 20 mole percent.

Polymer particles used in the present invention can be any size or shape depending on the use for which they are intended. The polymer particles can have a mean diameter of from about 10 to $10^4$ nm and preferably from about 20 to 1000 nm. Smaller particles tend to provide finer resolution. Mean diameter of a particle is defined as that measured by photon correlation spectroscopy.

The gelatin to be covalently bound to the polymer particles can be any of the known types of gelatin. These include, for example, alkali-treated gelatin (cattle bone or hide gelatin), acid-treated gelatin (pigskin or bone gelatin), and gelatin derivatives such as partially phthalated gelatin, acetylated gelatin, and the like, preferably the deionized gelatins. The gelatin covalently bound to the polymer particles may be cross-linked through the use of a conventional cross-linking agent. The gelatin layer on the polymer particles is preferably on the order of the thickness of one gelatin molecule. The actual thickness of the gelatin layer will depend on factors such as the molecular weight of the gelatin, the pH and the size of the particle, and is generally from about 10 to 60 nm and preferably from about 10 to 40 nm.

The polymer particles can be prepared by techniques well-known in the art, such as by polymerization followed by grinding or milling to obtain the desired particle size, or more preferably by emulsion or suspension polymerization procedures whereby the desired particle size can be produced directly as stable dispersions. Emulsion polymerization techniques can be employed to produce particle sizes ranging from about 10 to 5000 nm (preferably about 20 to 1000 nm) as stable aqueous dispersions that can be coated directly without isolation. Larger size particles, i.e., over about 3 μm are preferably prepared by suspension polymerization, often in an organic solvent system from which the particles are isolated and resuspended in water for most economic coating procedures, or most preferably by "limited coalescence" procedures taught by U.S. Pat. No. 3,615,972. The bulk, emulsion and suspension polymerization procedures are well-known to those skilled in the polymer art and are taught in such text books as W. R. Sorenson and T. W. Campbell, *Preparative and Methods of Polymer Chemistry*, 2nd ed., Wiley (1968) and M. P. Stevens, *Polymer Chemistry—An Introduction*, Addison Wesley Publishing Co., London, (1975).

The polymer particles, if the polymer is of the type as described above that is capable of bonding directly with gelatin, may be covalently bonded with gelatin simply by contacting the particles with gelatin under conditions as described below. If the polymer is of the type that utilized a grafting agent to bond with gelatin, the polymer particles are preferably first contacted with the grafting agent and then with gelatin, so that the gelatin preferentially reacts with the polymer particles, instead of gelatin-gelatin cross-linking. Carbamoyl pyridinium and dication ether grafting agents are advantageously utilized in the practice of this invention because they tend to first bond to a carboxyl group on a polymer particle and then with an amino group on the gelatin molecule.

The contacting of the polymer particles and gelatin is preferably performed in an aqueous dispersion of the particles. The concentration of polymer particles in the aqueous dispersion is preferably less than about 25% and more preferably less than about 15% by weight. The concentration of gelatin in the aqueous dispersion is preferably less than about 25% and more preferably less than about 15% by weight.

The pH of the aqueous dispersion and the concentration of the particles and gelatin should be adjusted to prevent bridging of gelatin molecules between polymer particles, or coagulation. The pH of the gelatin is preferably maintained above the isoelectric pH of the gelatin (e.g., above 5.8 and preferably between 8 and 10 for lime-processed bone gelatin). Under such conditions, both the particles and the gelatin should have the same charge, preferably negative, in order to minimize coagulation.

A preferred embodiment for the formulation of color filter arrays is a carboxylated polymer particle where B is a low glass transition temperature monomer, such as butylacrylate, and A is an acid pendent monomer, such as methacrylic acid. The composition of this copolymer is such that x is between 0.1 to 20 mole percent. The grafting reaction to gelation is carried out at a ratio between 10 parts gelatin to 1 part polymer latex and 1 part gelatin to 10 parts polymer latex and preferably between 2 parts gelatin to 1 part polymer and 1 part gelatin to 2 parts polymer. The grafting acids utilized are either carbamoylonium compounds or dication ethers. Particularly preferred are the carbamoylonium compounds 13 through 17 or suitable salts thereof. In the application of this invention the gelatin-graftedpolymer material can be washed either by dialysis or diafiltration to remove traces of reaction products and/or low molecular weight species.

The dye or dye-precursor can be loaded into the polymeric particles by techniques well known to those skilled in the art. Such techniques are described by T. J. Chen et al in U.S. Pat. Nos. 4,199,363; 4,214,047; 4,133,687; 4,127,499; 4,203,716; 4,247,627; and 4,127,499, the disclosures of which are hereby incorporated by reference. Such loading of the dye or dye-precursor preferably takes place prior to the grafting of gelatin onto the polymeric particle. A preferred technique involves imbibition of the hydrophobic dye or dye-precursor into latex polymer particles using a water miscible solvent which is subsequently evaporated off. A polymeric particle having a low glass transition temperature is preferred for the purpose of forming a stable dye-loaded particle. The composition of the polymer should be selected such that the hydrophobic material to be loaded is compatible therewith.

Any dye or dye-precursor which can be loaded into the polymeric particles covered with a layer of gelatin is useful in the practice of this invention.

Useful dye classes include azo anilines, azo pyridones, azo pyrazolones, merocyanines, methines, arylidenes, quinonimines, anthraquinones, naphthoquinones, quinonaphthalones and the like. Some specific structures of the dyes which can be utilized in the practice of the invention are as follows:

A. Azo Anilines:

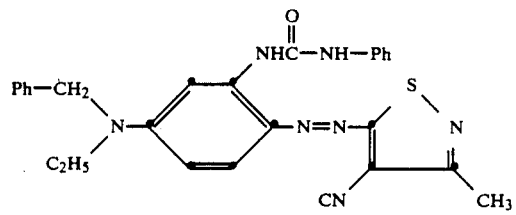

(A-1)

-continued
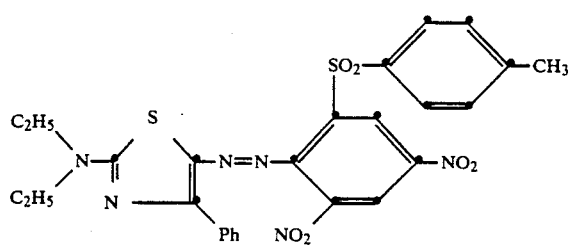 (A-2)
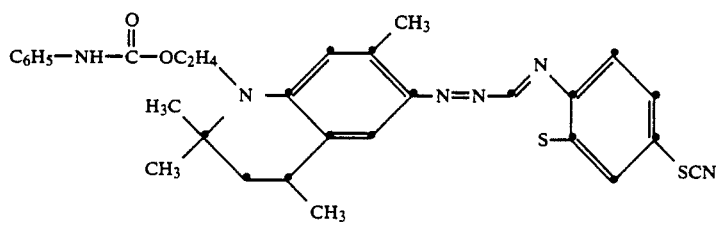 (A-3)
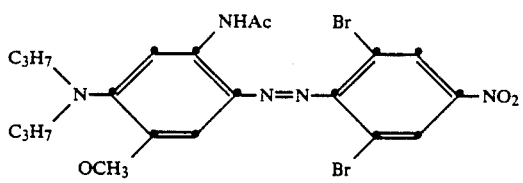 (A-4)
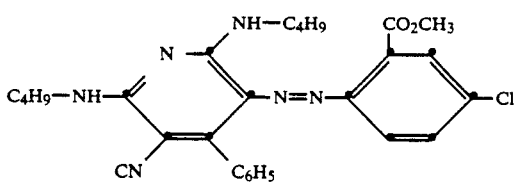 (A-5)
B. Azo-Pyridones and Pyrazolones:
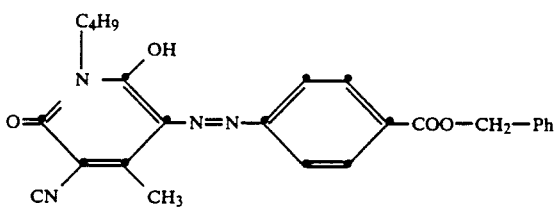 (B-1)
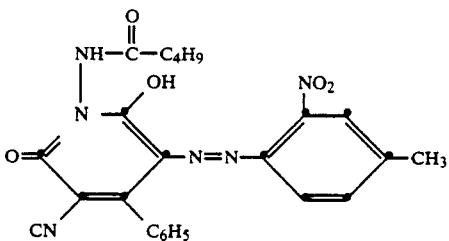 (B-2)
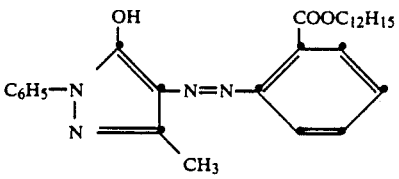 (B-3)

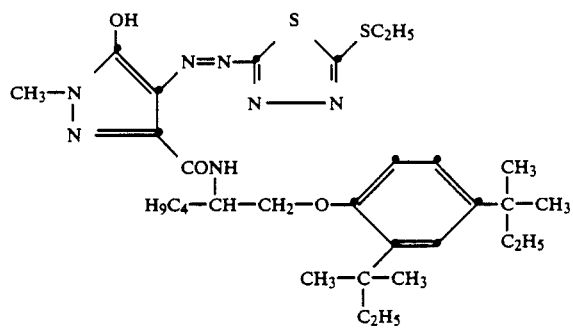
(B-4)
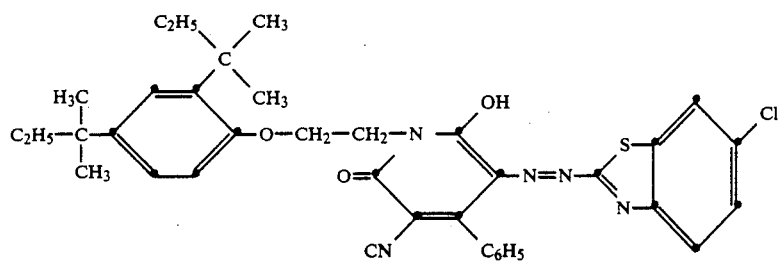
(B-5)
C. Merocyanines:
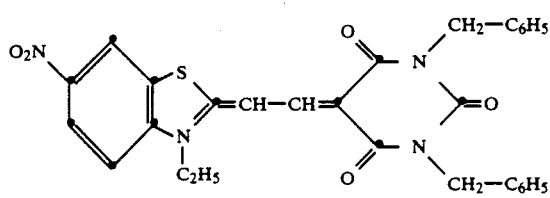
(C-1)
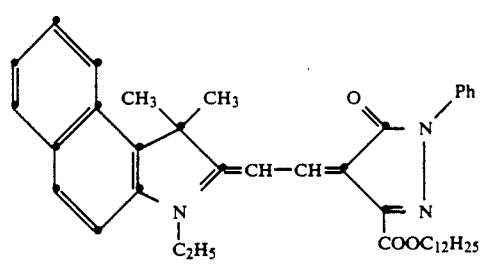
(C-2)
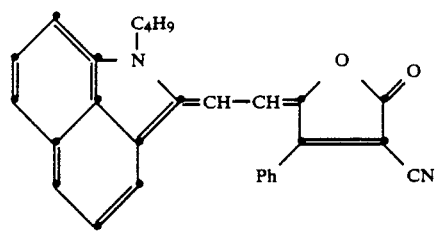
(C-3)
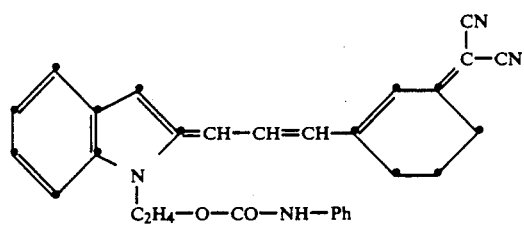
(C-4)

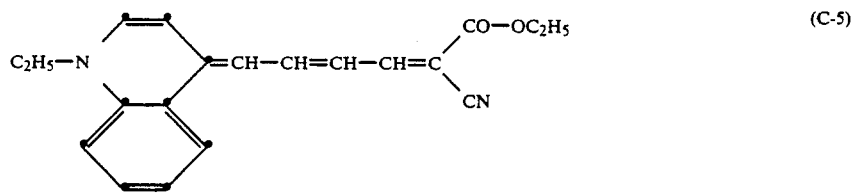 (C-5)
D. Styryls (Methines, Arylidenes):
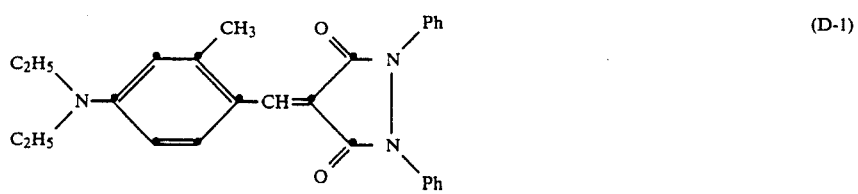 (D-1)
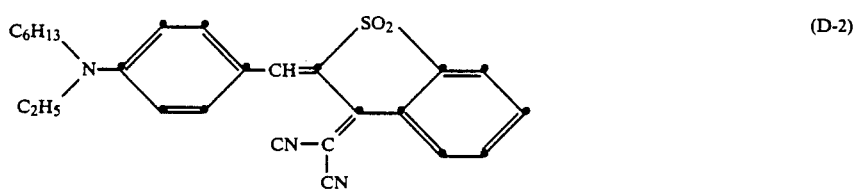 (D-2)
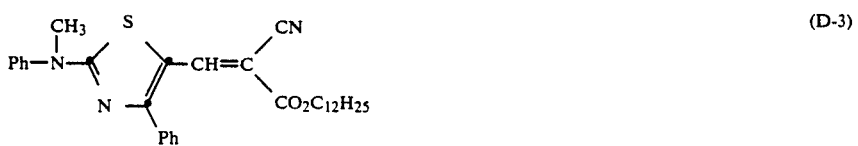 (D-3)
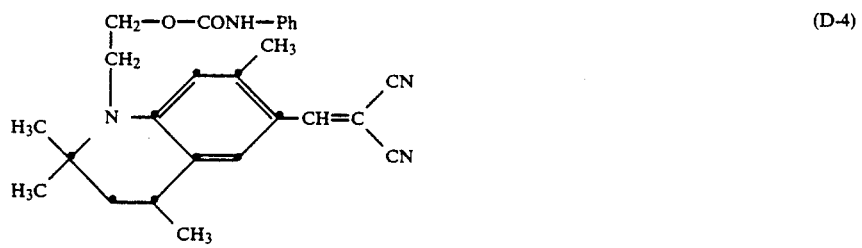 (D-4)
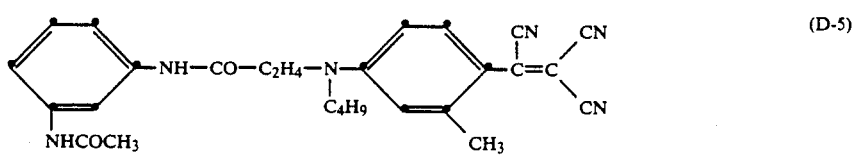 (D-5)
E. Quinoneimines:

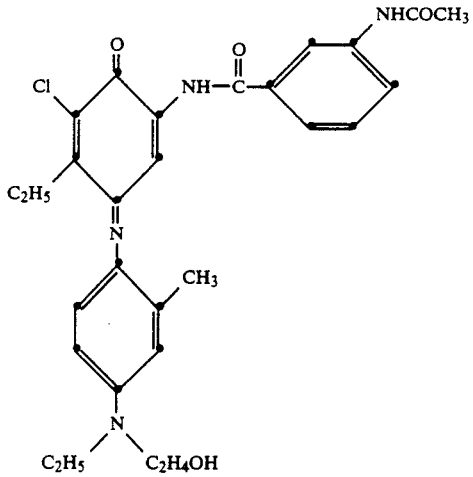
(E-1)
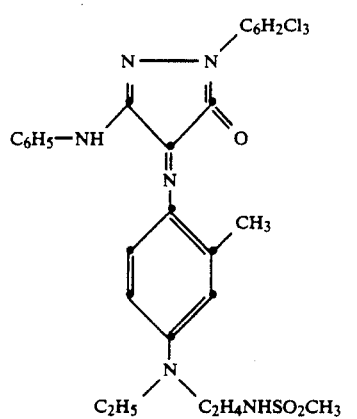
(E-2)
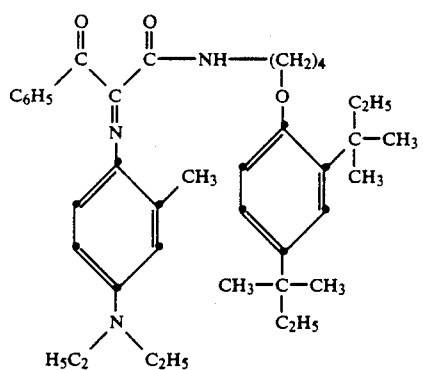
(E-3)
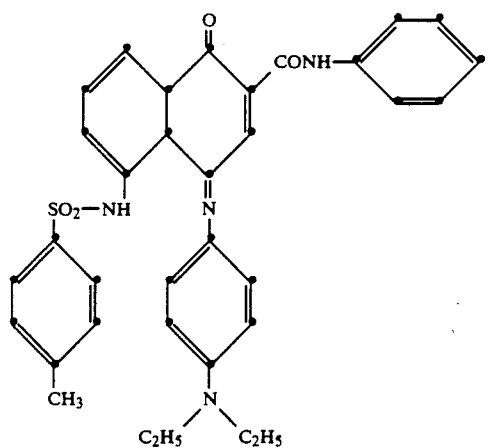
(E-4)

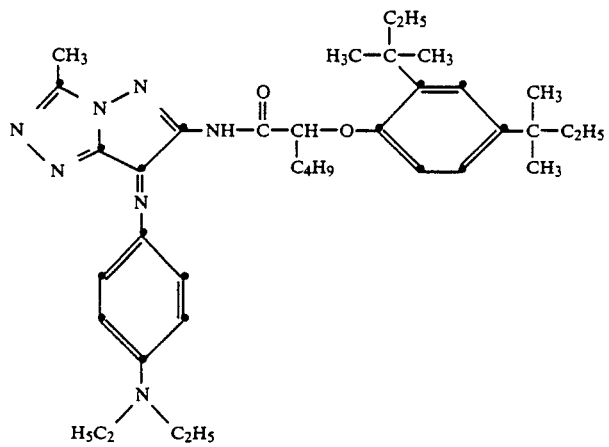

(E-5)

F. Anthra- and Naphthoquinone Dyes:

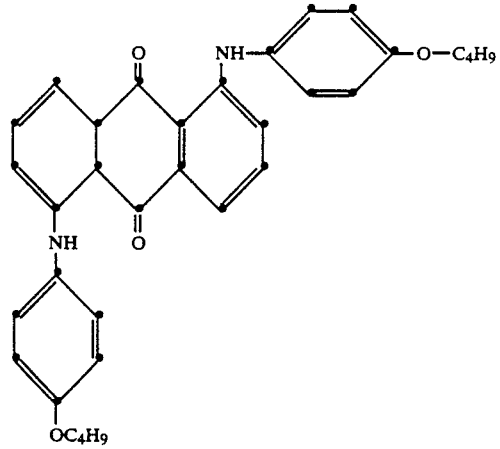

(F-1)

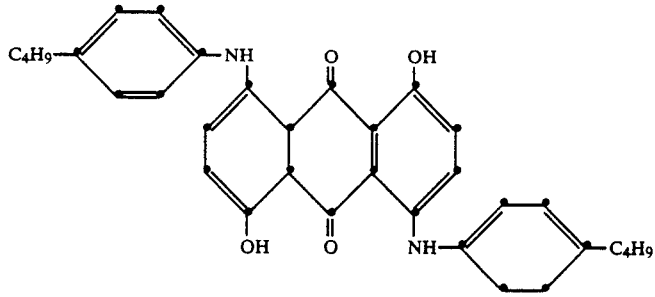

(F-2)

G. Quinonaphthalones:

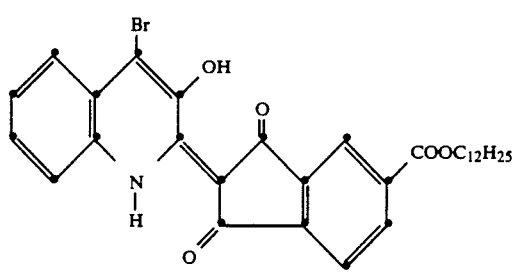

(G-1)

Any such dye loaded into the polymeric particle can be used to form a visual image in the resist. The particular dye selected will, of course, depend upon the desired color and therefore upon the desired end use. Preferred are dyes exhibiting minimal absorption in the UV range. The reason for this is that such dyes interfere less with the dichromate crosslinking reaction.

Alternatively, it is contemplated that dye-precursors can be loaded into the polymeric particle. The dye-precursor can be a photographic color coupler loaded inside the gelatin-grafted polymer particles. After image formation using bichromate and washing off of the unimaged areas, the remaining imaged area can be colored by dipping the image containing support in a solution of an oxidizing agent such as $(NH_4)_2S_2O_8$ (or other soluble oxidizing agent) and then into a basic solution of a standard paraphenylene diamine color developer such as described in Research Disclosure "Photographic Silver Halide Emulsion, Preparations, Processing and Systems", Number 308, December, 1989. Such a dye-precursor particle could also compose a polymeric coupler latex.

The loaded particles can also be composed of polymeric dye particles such as developed (i.e., particles reacted with an oxidized developer) polymeric coupler particles (such as described in U.S. Pat. No. 4,444,870). Examples of such gelatin graftable developed polymeric coupler particles are as follows:

Magenta

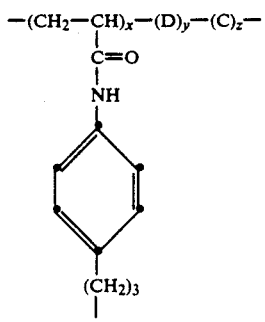

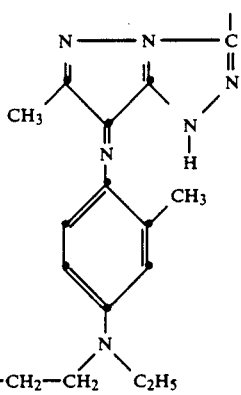

Cyan

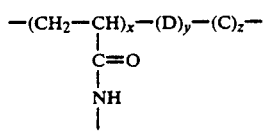

-continued

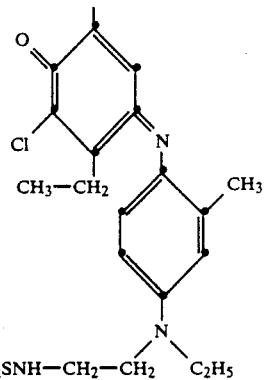

Yellow

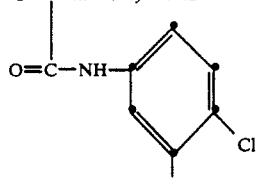

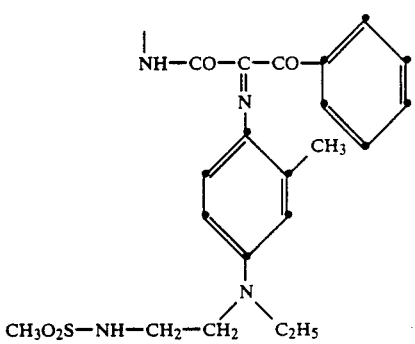

where
x+y+z=100% by weight,
x is from 5 to 95% by weight,
D is one or more ethylenically linked divalent monomers,
y is from 0 to 90%,
C is a monomer to which gelatin can be grafted to as described earlier, and
z is between 1 to 30%.

The gelatin grafted polymeric particles which preferably are loaded with a dye or dye precursor as described above are employed in combination with a radiation-responsive hardening agent such as a radiation-sensitive dichromate salt which functions as a hardening agent. The dichromate salt can be, for example, potassium, sodium or ammonium dichromate. Ammonium dichromate is particularly preferred for use herein. The dichromate sensitizer can conveniently be used in amounts of 0.001–0.10, preferably 0.005–0.05 weight percent based on the weight of the gel-grafted polymeric particles. The photoresist composition can be formed by mixing the dye-loaded polymeric particles covered with the layer of gelatin with the dichromate sensitizer in a suitable solvent such as water.

The resist composition of this invention can optionally include a variety of conventional addenda, for example, surfactants and/or stabilizers.

The dyeable resist composition of the invention is preferably applied to a suitable support and contact or projection-exposed imagewise to activating radiation. As used herein "support" includes semiconductor substrates including, if present, various levels of, for example, oxides, metallization, doped semiconductor material, insulators, and/or planarizing layers. Useful supports include sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylons, cellulose ester film base, e.g., cellulose acetate, cellulose acetate propionate, cellulose acetate butyrate and cellulose nitrate. For the manufacture of integrated circuit devices, silicon wafers, silicon nitride, and chromium-coated glass plate supports are particularly useful. Depending on the support selected, adhesion aids are optionally applied first as a sub-coating.

A variety of alternative semiconductor image sensor support constructions are known in the art and are useful in forming the color imaging sensor of this invention. Representative examples of useful semiconductive supports are disclosed in U.S. Pat. Nos. 3,971,065, 4,322,753, 4,455,575 and 4,654,683. Preferred semiconductive supports have a surface comprising an array of light sensing pixels, wherein each pixel preferably is less than $1 \times 10^{-8}$ m$^2$ in area. A more detailed description of a preferred support structure is provided in European Patent Application 249,991.

As employed herein the term "pixel" is defined as a single areally limited information unit of an image. The number of pixels making up an image can be varied widely, depending upon the application. For color imaging sensors according to this invention it is preferred that the support contain at least about $2 \times 10^5$ pixels, and for high visual quality, at least $1 \times 10^6$ pixels.

A photopatterned filter layer is most conveniently constructed by coating a solution of the negative-working resist composition onto a planar semiconductive surface. Any conventional method can be used to apply the composition to the support. The preferred method is application of a thin coating using an appropriate solvent. In making color filter elements for high resolution solid state imaging devices it is most common to coat the photopatternable resist layer by spin coating, however, other methods are useful. Useful coating techniques include spin coating, spray coating, curtain coating, and roll coating. The solvent used to prepare the resist composition for coating can be selected from any conventional coating solvent. Useful solvents include water and water miscible organic solvents such as alcohols, esters, ethers, and ketones. A particularly preferred solvent is water. Preferred final thicknesses of the resist vary, depending upon the desired optical density of the filter and the final use. Examples of preferred thicknesses range from between about 0.1 micrometer to about 10 micrometers.

It is contemplated that the filter elements can be provided on the semiconductive support in a variety of patterns. For high resolution sensors, it is preferred that the filter elements be provided in an interlaid pattern as described in European Patent Application 249,991 or in the form of tiny islands, such as described in U.S. Pat. No. 4,315,978.

Additive primary (blue, green and red) filter elements can be formed by imagewise exposing a layer comprised of the above-described resist. Following development to remove unexposed portions of the layer, the additive primary dye is imbibed. The process can be twice repeated to produce the second and third sets of additive primary filters. Mixtures of subtractive primary (yellow, magenta and cyan) dyes can be used to form additive primary filters. Alternatively, additive primary filter elements can be formed by superimposing two filter elements containing subtractive primary dyes.

Any form of exposure to which the resist is responsive can be used. Because the dichromate sensitizer is primarily responsive to UV light, the light source preferably is rich in UV. Conventional light sources of such character are readily available, and can be used. The preferred exposure technique depends of course upon the end result desired.

As used herein the term "microregistration" means that the filter elements and light sensing pixels are precisely aligned on a micron scale such that the filter area and the underlying sensing area or areas are substantially coextensive with each other. Further, the boundaries of such areas are substantially superimposed. A single filter element may be superimposed over one sensing area or a group of sensing areas. The importance of microregistration is readily apparent when one considers the very small size of the pixels useful in high resolution color image sensing devices and thus the correspondingly small size of the superposed filter elements. A mask aligner was used for microregistration.

As noted, a particularly advantageous feature of this invention is that the photoresist can be pre-dyed by loading dye into the polymeric particles. Dye wandering or leaching is minimized because the hydrophobic dye is loaded inside the polymeric particle. Consequently, no barrier layers are required to prevent dye migration or contamination between adjacent color filter layers.

EXAMPLES

The following examples further illustrate the invention. Parts and percentages are by weight unless otherwise specified.

Preparation of the Latex

A surfactant free poly(Butylacrylate-co-chloromethylstyrene-co-styrene sulfonic acid sodium salt) latex in the weight ratio of the monomers of 88:10:2, respectively, was prepared by the following procedure. In a thin neck two liter round bottom flask was placed 1000 g of distilled water. The flask was purged with nitrogen for 15 minutes and placed in a constant temperature bath at 60° C. and fitted with an air driven stirrer, a condenser and a blanketing flow of nitrogen. The following monomers were mixed and added to the flask:

88 g Butyl acrylate (P)
10 g Chloromethyl styrene (Q)

The charged monomer, 2 g of styrene sulfonic acid sodium salt, (R) was then added to the mixture. The polymerization ratio was started by the addition of the following index initiators:

2 g $K_2S_2O_8$
1 g $Na_2S_2O_5$

Reaction was carried out for 18 hours at 60° C. The resultant latex dispersion, PQR (88/10/2), had a solids content of 8.2%. The particle diameter of the latex as measured by photon correlation spectroscopy (PCS) was about 65 nm.

Loading of Dye into the Latex

A cyan dye having the structural formula:

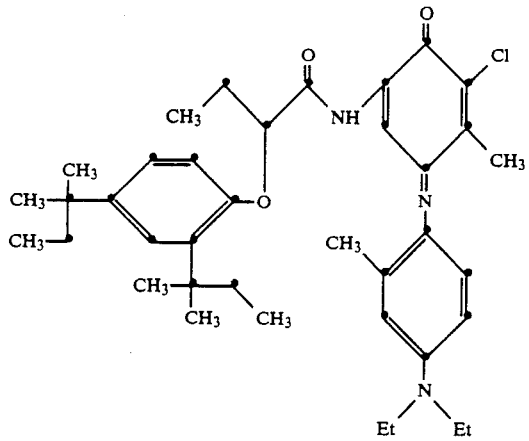

which was prepared by a known synthetic technique was dissolved in 800 ml of tetrahydrofuran (THF) at room temperature. 200 g of the PQR(88/10/2) latex (@ 8.2% solids) was diluted to 800 g with distilled water. The dye solution was added to the diluted latex dispersion very rapidly. The THF was removed at 60° C. under vacuum. Thus was formed a dye-loaded latex dispersion at a load ratio of about 1 part latex to 1 part dye. The loaded latex dispersion was filtered through a coarse filter paper. A stable dark blue dispersion was obtained. The total solids of this dispersion was determined to be 4.0%. The dispersion was stored at room temperature and was found to be stable for at least six weeks from crystallization of the dye.

Grafting of Gelatin onto the Dye-Loaded Latex Dispersion 750 ml of the dye-loaded latex was placed in a 2 liter three neck round bottom flask. It was placed in a constant temperature bath at 60° C. and fitted with an air driven stirrer and a condenser. The pH of the dispersion was adjusted to 8.0 using 20% NaOH solution. The dispersion contained 30 g of the dry dyed latex, 300 cc of 10% lime processed ossein gelatin was prepared at 60° C. and pH=8.0. It contained 30 g of dry gelatin. The gelatin solution at 60° was added to the dyed latex dispersion at 60° and reaction continued for 2 hours at 60° C. to graft the gelatin onto the surface of the dyed-latex particles according to the following reaction scheme:

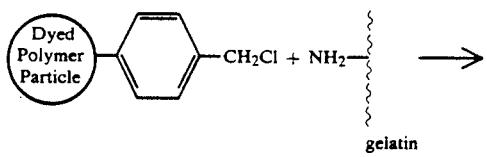

-continued

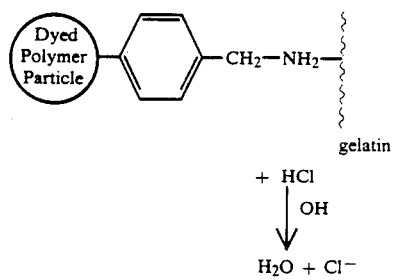

To the formed dispersion was added 2 g of sodium dodecyl sulfate for further dispersion stability and filtered through a coarse glass fritted Buchner funnel. The total solids in the final dispersion was determined to be 6.0%. According to the preparation, the solids contained 50% dry gelatin, 25% of the latex, and 25% dye.

Fabrication of Color Filter Array Image Using Gelatin-Grafted Dye-Loaded Polymer Latex Particles To 25 ml of the gelatin-grafted dye-loaded latex dispersion was added 0.5 ml of a 10% $(NH_4)_2Cr_2O_7$ photosensitizer solution, which was adjusted to pH=7.0, using $NH_4OH$ with rapid stirring. The $NH_4OH$ also acted as a rate regulator of the crosslinking reaction. This solution was then spin coated at 1000 RPM on a gel subbed 2"×2" glass plate which was dried at 1000 RPM for 2 minutes. The glass plate was then exposed through a CFA (color filter array) chrome mask with 10 micrometer wide lines and 10 micrometer wide spaces in series for 5 seconds to 100 m Joule/cm$^2$ intensity using a He—Xe lamp. The He—Xe lamp is used to provide UV exposure between about 350 to 450 nm with strong lines at 365 nm, 405 nm and at 436 nm. The exposure photocrosslinked the image areas and the coating in the non-image area was washed out using warm distilled water for 45 seconds. A cyan image of this CFA mask was observed on the glass plate.

In a second experiment, a glass plate was similarly coated at 500 RPM twice and imaged in a similar manner. Again, a well resolved cyan colored image was observed. In both the experiments no scum formation in the background was observed.

Figure 2:
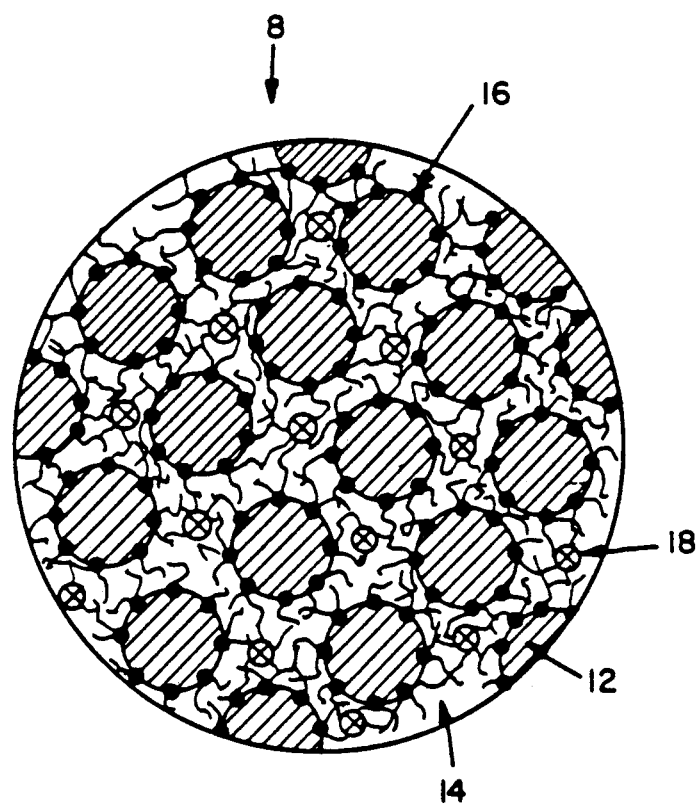
FIG. 2 is a submicroscopic view of the circular section 8 of FIG. 1 illustrating the crosslinked gel-grafted polymer particles.
Figure 3:
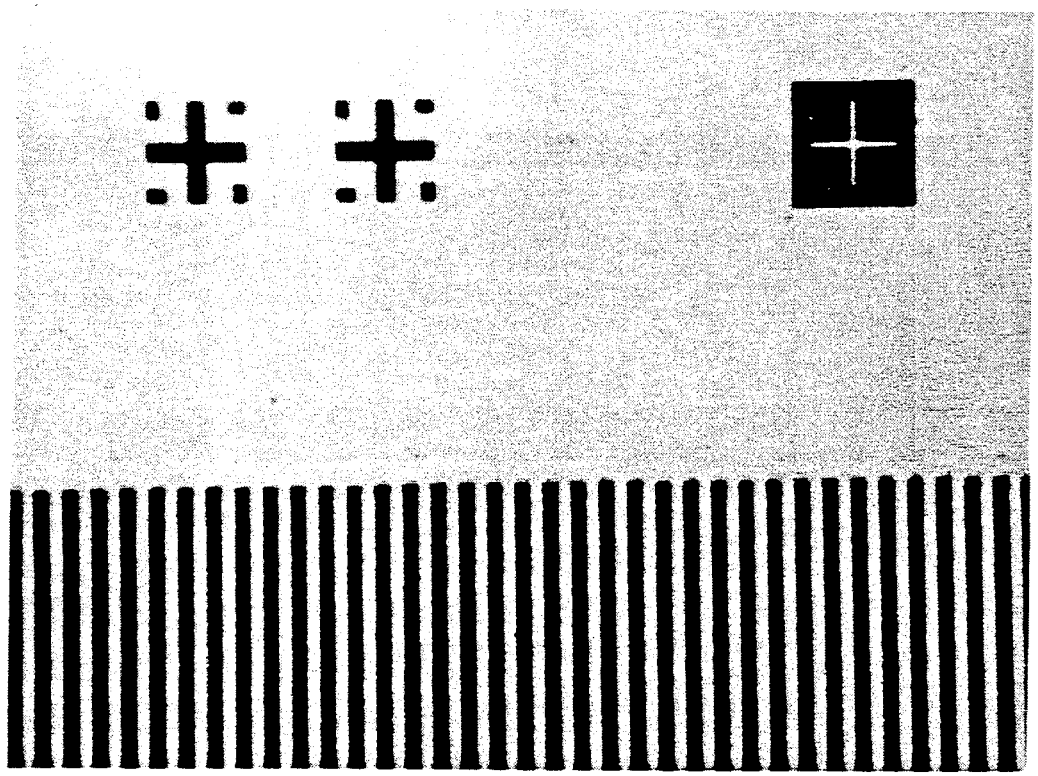
FIG. 3 is a black and white photomicrograph of a scum free resist image in accordance with this invention.

With reference to the drawings, FIG. 1 shows a schematic view of a developed photoresist image made with dye-loaded-gel grafted polymer particles using a bichromate photocrosslinker as described in the examples above. Support material 28 as described above, includes adhesion promoting layer 26 such as a very thin gelatin layer and the crosslinked colored image of the photoresist composition 24 of this invention. The microscopic area 8 of the photoresist image of FIG. 1 is shown in an enlarged view in FIG. 2. In FIG. 2, the individual dye-loaded gelatin-grafted polymer particles 12 contain gelatin-grafting points 16 on the surface thereof. The continuous outer gelatin-phase 14 contains bichromate crosslink points 18 which have crosslinked the dye-loaded gelatin-grafted polymer particles. FIG. 3 is a black and white photomicrograph of the image formed in the process described in the example above of 10 micron lines and spaces illustrating a scum free image from the photoresist composition of this invention.

The invention has been described in detail with particular reference to certain preferred embodiments thereof, but it will be understood that variations and modifications can be effected within the spirit and scope of the invention.

What is claimed is:

1. A negative-working photoresist composition comprising in admixture (a) dye-loaded or dye precursor-loaded polymeric particles individually covered with a layer of gelatin that is covalently bonded thereto and (b) a radiation-sensitive dichromate.

2. The composition of claim 1 wherein said polymeric particles have a mean diameter from 10 to $10^4$ nm.

3. The composition of claim 1 wherein the layer of gelatin has a thickness from 10 to 60 nm.

4. The composition of claim 1 wherein said polymeric particles are derived from butylacrylate, chloromethyl styrene and styrenesulfonic acid sodium salt.

5. The composition of claim 1 wherein said dichromate is ammonium dichromate.

6. The composition of claim 1, wherein said polymer particles have a mean diameter between 10 and 500 nm.

7. The composition of claim 1, wherein said polymer particles comprise ethylenically linked divalent monomers.

8. The composition of claim 1 wherein the polymeric particles contain at least 0.5 percent by weight of carboxylic acid groups, active halogen containing groups, aldehyde groups, aziridene groups or isocyanate groups.

9. The composition of claim 8 wherein said composition contains a gel grafting agent and said gel grafting agent is selected from the group consisting of a carbamoylonium salt, a dication ether or a carbodiimide.

10. The composition of claim 1 wherein the loaded dye is selected from the group consisting of:
azo anilines, azo pyridines, azo pyrazolones, merocyanines, methines, arylidenes, quinonimines, anthraquinones, naphthoquinones and quinonaphthalones.

11. The composition of claim 1 wherein the polymeric material is derived from a polymer that has a glass transition temperature less than 25° C.

12. The composition of claim 1 wherein the weight ratio of said polymer particle to gelatin is from 1 to 2 to 2 to 1.

13. The composition of claim 1 wherein the dye-precursor is a photographic color coupler.

14. The composition of claim 1 wherein the dyed particles comprise a copolymerized dye monomer.

15. The composition of claim 1 wherein the dyed particle is a dye developed polymeric coupler particle.

16. The composition of claim 1 wherein the dye precursor is a dye developable polymeric coupler.

* * * * *